(12) United States Patent
Lu et al.

(10) Patent No.: US 12,379,804 B2
(45) Date of Patent: *Aug. 5, 2025

(54) ORGANIC LIGHT-EMITTING DIODE DISPLAY PANEL AND DISPLAY DEVICE

(71) Applicant: Hubei Yangtze Industrial Innovation Center Of Advanced Display Co., Ltd., Wuhan (CN)

(72) Inventors: Feng Lu, Shanghai (CN); Qijun Yao, I, Shanghai (CN)

(73) Assignee: Hubei Yangtze Industrial Innovation Center of Advanced Display Co., Ltd., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/738,625

(22) Filed: Jun. 10, 2024

(65) Prior Publication Data

US 2024/0334771 A1    Oct. 3, 2024

Related U.S. Application Data

(63) Continuation of application No. 18/097,764, filed on Jan. 17, 2023, now Pat. No. 12,010,889, which is a
(Continued)

(30) Foreign Application Priority Data

Dec. 30, 2020  (CN) .......................... 202011615852.3

(51) Int. Cl.
  *G06F 3/041*    (2006.01)
  *G06F 3/044*    (2006.01)
(Continued)

(52) U.S. Cl.
  CPC ........ *G06F 3/0412* (2013.01); *H10K 50/813* (2023.02); *H10K 50/844* (2023.02);
(Continued)

(58) Field of Classification Search
  None
  See application file for complete search history.

(56) References Cited

U.S. PATENT DOCUMENTS

2021/0159299 A1*  5/2021  Wang .................... H10K 59/131
2021/0210588 A1*  7/2021  Liu ...................... H01L 27/1225

FOREIGN PATENT DOCUMENTS

CN          111341812 A  *  6/2020  ........... H01L 27/322

\* cited by examiner

*Primary Examiner* — Duane N Taylor, Jr.
(74) *Attorney, Agent, or Firm* — KDW Firm PLLC

(57) ABSTRACT

Provided are a display panel and a display device. The display panel includes a substrate, a drive module layer, a first auxiliary layer, an anode layer, and an auxiliary conductive portion. The drive module layer, the first auxiliary layer, the anode layer, the organic light-emitting layer and the cathode layer are sequentially disposed on the substrate. The drive module layer is provided with a plurality of drive modules; and the anode layer includes a plurality of blocky anodes. The projection of at least part of the auxiliary conductive portion in a direction perpendicular to the substrate is located between the blocky anodes. At least one jumper layer is disposed between the drive module layer and the first auxiliary layer, where the at least one jumper layer is disposed on a side of the auxiliary conductive portion close to the substrate.

20 Claims, 13 Drawing Sheets

Related U.S. Application Data continuation of application No. 17/235,926, filed on Apr. 20, 2021, now Pat. No. 11,569,337.

(51) Int. Cl.
*H10K 50/813* (2023.01)
*H10K 50/844* (2023.01)
*H10K 59/122* (2023.01)
*H10K 59/131* (2023.01)
*H10K 59/40* (2023.01)
*H10K 59/80* (2023.01)

(52) U.S. Cl.
CPC ......... *H10K 59/122* (2023.02); *H10K 59/131* (2023.02); *H10K 59/40* (2023.02); *H10K 59/80515* (2023.02); *H10K 59/873* (2023.02); *G06F 3/0443* (2019.05); *G06F 3/0446* (2019.05)

ORGANIC LIGHT-EMITTING DIODE DISPLAY PANEL AND DISPLAY DEVICE

CROSS-REFERENCE TO RELATED APPLICATION

This is a Continuation Application of US patent application U.S. Ser. No. 18/097,764 which is a continuation of U.S. application Ser. No. 17/235,926 filed on Apr. 20, 2021, which claims priority to Chinese patent application No. 202011615852.3 filed Dec. 30, 2020, disclosures of which are incorporated herein by reference in their entireties.

FIELD

The present disclosure relates to the field of display and, in particular, to a display panel and a display device.

BACKGROUND

A light-emitting diode (LED) display device is a self-luminous display device. In one embodiment, a light-emitting material is driven by an electric field to cause light emission through carrier injection and recombination. The light-emitting display device has received extensive attention due to factors such as lightness and thinness, wide viewing angle and high contrast.

However, in the display process of the related light-emitting display panels, user experiences are poor due to complicated wiring and occupation of relatively more space.

SUMMARY

Embodiments of the present disclosure provide a display panel and a display device to save space and improve the use effect of the display panel.

In one embodiment of the present disclosure provides a display panel. The display panel includes a substrate, a drive module layer, a first auxiliary layer, an anode layer, and an auxiliary conductive portion.

The drive module layer, the first auxiliary layer, the anode layer, are sequentially disposed on the substrate, where the drive module layer is provided with a plurality of drive modules; and the anode layer includes a plurality of blocky anodes.

The projection of at least part of the auxiliary conductive portion in a direction perpendicular to the substrate is located among the plurality of blocky anodes.

At least one jumper layer is disposed between the drive module layer and the first auxiliary layer, where the at least one jumper layer is disposed on a side of the auxiliary conductive portion close to the substrate; the at least one jumper layer includes a plurality of jumper portions; a blocky anode of the plurality of blocky anodes is electrically connected to a drive module corresponding to the blocky anode through one of the plurality of jumper portions.

On the direction perpendicular to the substrate, the auxiliary conductive portion at least partially overlaps the plurality of jumper portions.

In another embodiment of the present disclosure provides a display device. The display device includes the display panel of any one of the embodiments of the present disclosure.

DETAILED DESCRIPTION

Figure 1:
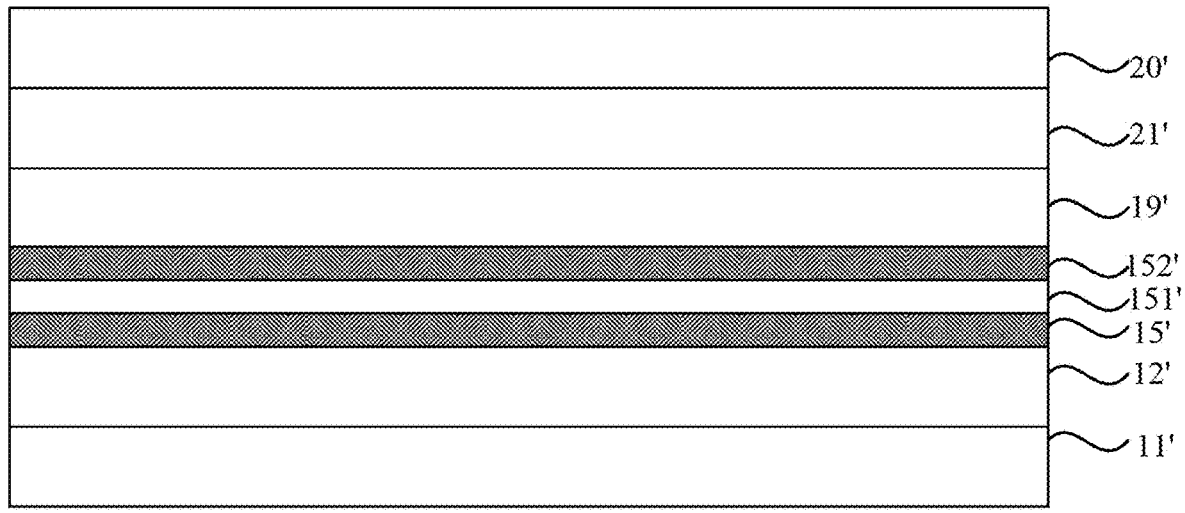
FIG. 1 is a structural view of a display panel in the related art.

The present disclosure is further described below in detail in conjunction with the drawings and embodiments. It is to be understood that the embodiments described herein are merely intended to explain the present disclosure and are not intended to limit the present disclosure. Additionally, it should be noted that for ease of description, only the part, instead of all, related to the present disclosure is illustrated in the drawings.

FIG. 1 is a structural view of a display panel in the related art. In one embodiment, FIG. 1 illustrates a film structure of an organic light-emitting display panel integrated with a touch function. The touch function may be implemented through the principle of touch panel (TP) on the TFE (TPOT). As shown in FIG. 1, the display panel includes a driver circuit layer 12', an anode layer 15', an organic light-emitting layer 151', a cathode layer 152' and an encapsulation layer 19' which are sequentially disposed on a substrate 11'. A touch circuit layer 21' is formed by directly using the encapsulation layer 19' as a substrate. The touch circuit layer 21' includes at least one layer of touch electrodes to implement the touch function, and the touch circuit layer 21' may further be provided with structures such as a polarizer 20'. However, in the process of implementing the disclosure, it is found that the above film structure is complex in wiring and occupies a large space, bringing a poor experience to a user. An embodiment of the present disclosure provides a display panel. The display panel includes a substrate, a drive module layer, a first auxiliary layer, an anode layer, an organic light-emitting layer, a cathode layer and an auxiliary conductive portion.

The drive module layer, the first auxiliary layer, the anode layer, the organic light-emitting layer and the cathode layer are sequentially disposed on the substrate. The drive module layer is provided with multiple drive modules; and the anode layer includes multiple blocky anodes.

The projection of at least part of the auxiliary conductive portion in a direction perpendicular to the substrate is located among the multiple blocky anodes.

At least one jumper layer is disposed between the drive module layer and the first auxiliary layer. The jumper layer is disposed on a side of the auxiliary conductive portion close to the substrate; the jumper layer includes multiple jumper portions; the blocky anode is electrically connected to a drive module corresponding to the blocky anode through one jumper portion.

On the direction perpendicular to the substrate, the auxiliary conductive portion at least partially overlaps the multiple jumper portions.

In the present disclosure, a display panel includes a drive module layer, a first auxiliary layer, an anode layer which are sequentially disposed on a substrate. The first auxiliary layer is a planarization layer. The drive module layer is provided with multiple drive modules; and the anode layer is provided with blocky anodes corresponding to the drive modules. The display panel is further provided with an auxiliary conductive portion which is insulated from the blocky anodes. In addition, at least one jumper layer is disposed between the drive module layer and the first auxiliary layer, so that the blocky anode is electrically connected to a drive module corresponding to the blocky anode through one jumper portion. On a plane where the substrate is located, the auxiliary conductive portion at least partially overlaps the multiple jumper portions. Therefore, through the bridging between film layers achieved by the jumper portions, the area of a connection portion for connecting a blocky anode and a drive module can be reduced, which is conducive to increasing the width of a gap region between blocky anodes, saving space for the layout of the auxiliary conductive portion, and preventing the problem that the gap region is too narrow to dispose the auxiliary conductive portion. In this way, the width of the auxiliary conductive portion may be set to be slightly wider, so that the difficulty of the process of disposing the auxiliary conductive portion is reduced, the process of manufacturing the display panel is accelerated, and the manufacturing quality of the display panel is improved.

Figure 2:
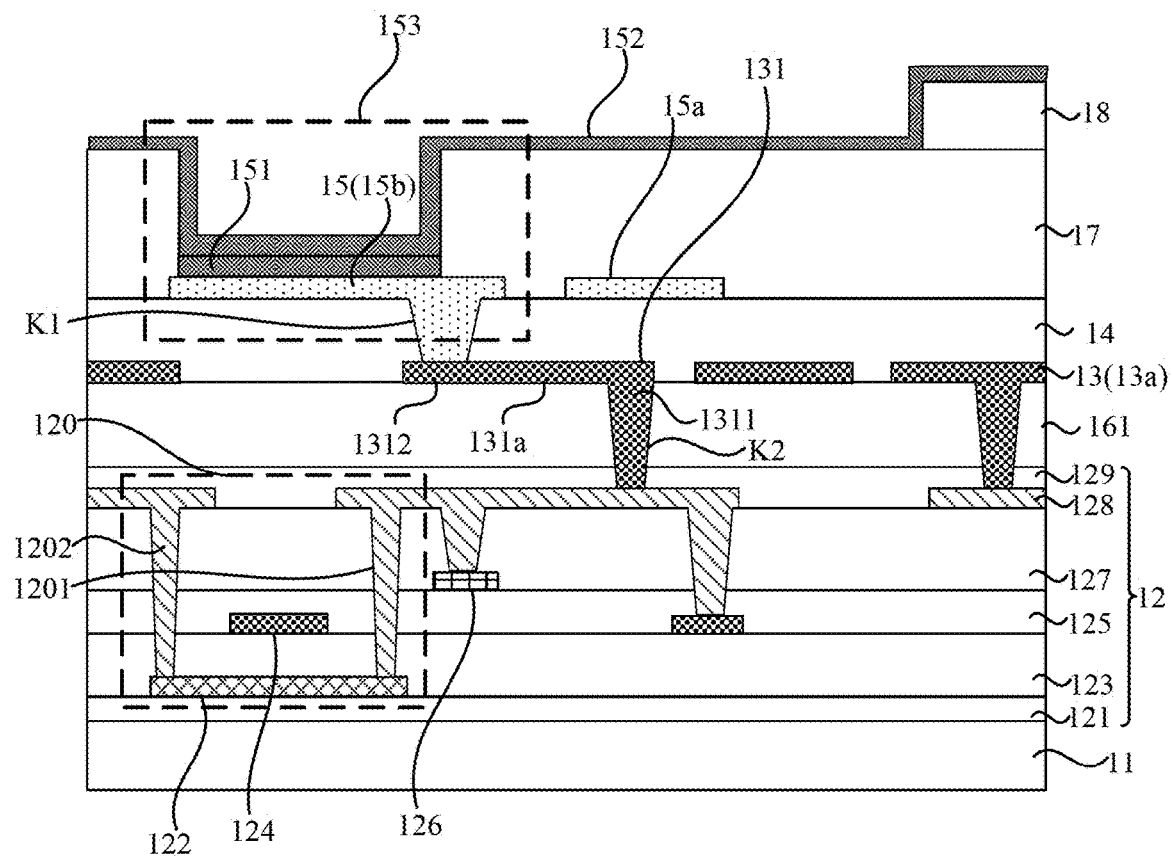
FIG. 2 is a structural view of a display panel according to an embodiment of the present disclosure.

FIG. 2 is a structural view of a display panel according to an embodiment of the present disclosure. As shown in FIG. 2, a display panel includes a substrate 11 and a drive module layer 12, a first auxiliary layer 14, an anode layer 15, an organic light-emitting layer 151 and a cathode layer 152 which are sequentially disposed on the substrate 11. The stacked structure formed by the anode layer 15, the organic light-emitting layer 151 and the cathode layer 152 may form an OLED light-emitting structure to emit light required for display. In one embodiment, the anode layer 15 includes multiple discrete blocky anodes 15b, and all of the blocky anodes 15b are stacked with the organic light-emitting layer 151 and the cathode layer 152 to form multiple discrete subpixels 153. The drive module layer 12 is provided with multiple drive modules 120, and the drive modules 120 may be disposed in correspondence to the subpixels 153. In an embodiment, the drive modules 120 are disposed in one-to-one correspondence the subpixels 153, and the drive module 120 transmits an anode voltage to the corresponding blocky anode 15b to drive the subpixel 153 to emit light. Optionally, the first auxiliary layer is a planarization layer.

Figure 3:
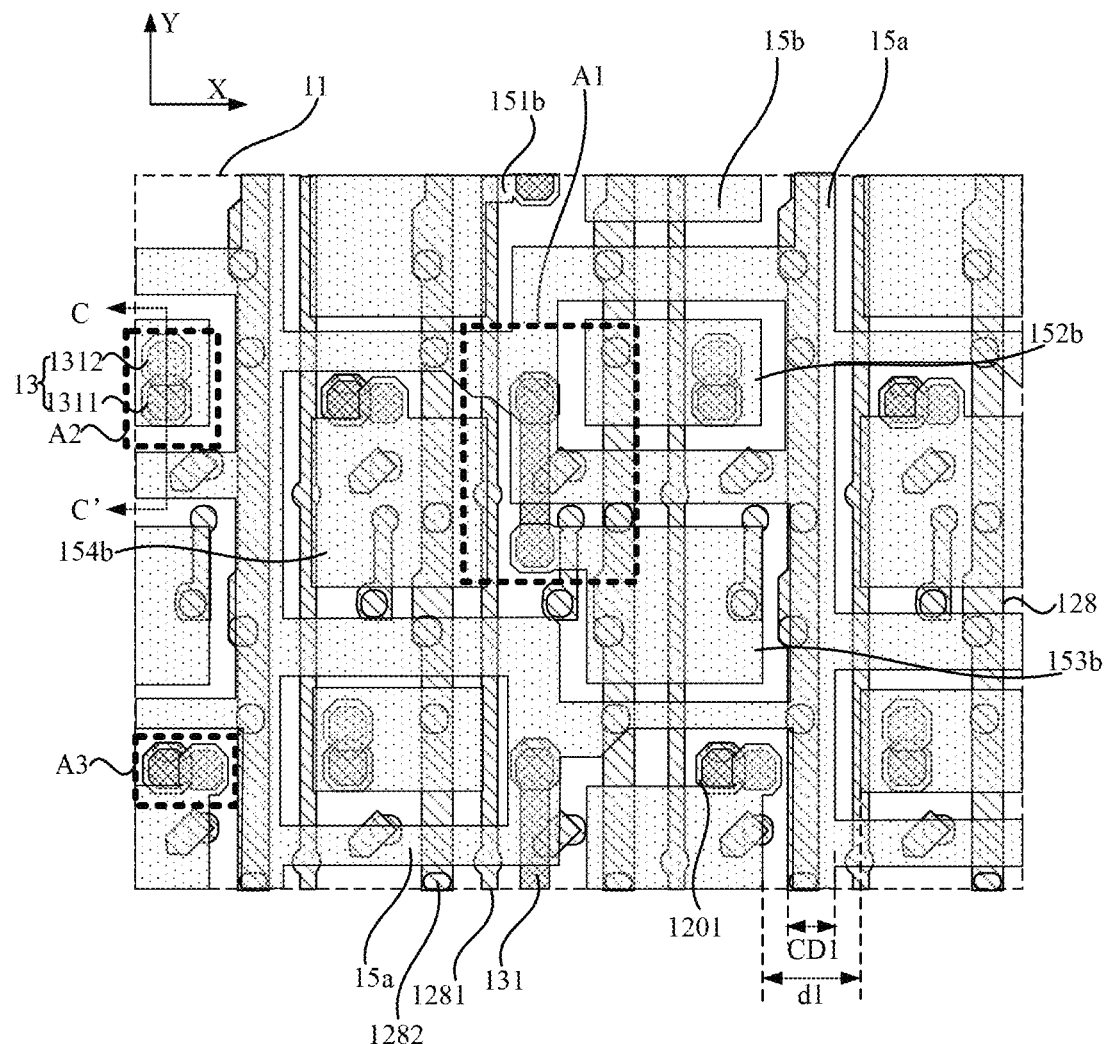
FIG. 3 is a top structural view of a display panel according to an embodiment of the present disclosure.
Figure 4:
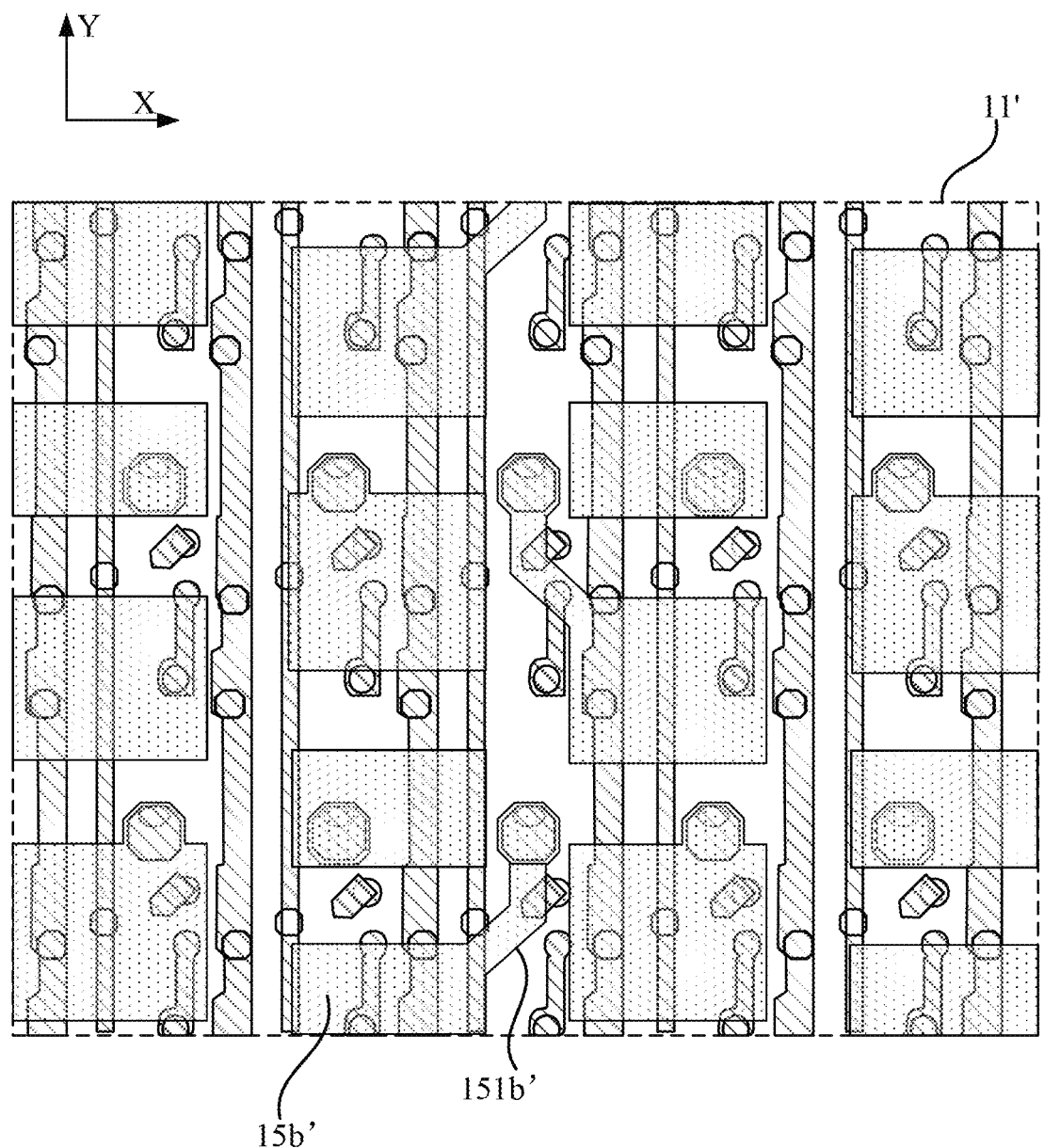
FIG. 4 is a structural view of a comparative example of a display panel according to an embodiment of the present disclosure.

In the present disclosure, the display panel may further be provided with an auxiliary conductive portion 15a. Referring to FIG. 3, FIG. 3 is a top structural view of a display panel according to an embodiment of the present disclosure. The display panel includes the auxiliary conductive portion 15a. On a plane parallel to a plane where the substrate 11 is located, the auxiliary conductive portion 15a is disposed in a gap region d1 between adjacent two blocky anodes 15b and is not connected to the blocky anodes 15b. That is, the auxiliary conductive portion 15a is disposed insulated from adjacent blocky anodes 15b. Referring to FIG. 4, FIG. 4 is a structural view of a comparative example of a display panel according to an embodiment of the present disclosure. Since the comparative example shown in FIG. 4 is not provided with an auxiliary conductive portion, in order to connect the blocky anode 15b' and the corresponding drive module, a relatively long connection portion 151b' needs to be disposed in the gap region between the blocky anodes 15b', so that the width of the gap region is relatively small, and thus it is difficult to dispose the connection portion 151b'.

Referring to FIG. 2 and FIG. 3, at least one jumper layer 13 may further be disposed between the drive module layer 14 and the first auxiliary layer 12. Since the auxiliary conductive portion 15a needs to be disposed between adjacent blocky anodes 15b, it is necessary to reserve a relatively wide range for the gap region d1 between adjacent blocky anodes 15b for ease of disposing the auxiliary conductive portion 15a. In the embodiment, the auxiliary conductive portion 15a and the blocky anodes 15b may be disposed in a same layer as shown in FIG. 2, or the auxiliary conductive portion 15a and the blocky anodes 15b may be disposed in different layers, as long as it is ensured that the auxiliary conductive portion 15a is disposed in the gap region between adjacent two blocky anodes 15b on the plane parallel to the plane where the substrate 11 is located and does not block the area directly facing the blocky anode 15b and the cathode layer. In this embodiment, the auxiliary conductive portion 15a may be an information transmission line, for example, a signal line through which a driver circuit transmits an initialization signal, a reset and a fixed signal, or a signal line to be in parallel with other signal lines to reduce resistance. Further, the auxiliary conductive portion 15a is disposed to form capacitance between the cathode layer and the auxiliary conductive portion 15a to maintain a stable potential of the cathode layer, so that the auxiliary conductive portion 15a should be disposed as close to the cathode layer as possible. The auxiliary conductive portion 15a may be disposed in the anode layer and is disposed in a same layer as the blocky anodes 15b, or the auxiliary conductive portion 15a may be disposed on a side of the anode layer close to the cathode layer, enhancing the effect of stabilizing the potential on the cathode layer by the auxiliary conductive portion 15a and improving the stability of a display picture of the display panel.

In an embodiment, the organic light-emitting display panel in the embodiment may be integrated with a touch function, for example, a touch electrode layer may be disposed. The touch electrode layer may be embedded in the organic light-emitting display panel or may be disposed on a display side of the organic light-emitting display panel, and the position at which the touch electrode layer is disposed is not limited in the embodiment. A cathode of a display panel is always on to stabilize a low potential. The cathode is easily to produce potential fluctuations due to a current when the organic light-emitting layer emits light, causing the problem of instability of the cathode potential. Moreover, parasitic capacitance may be produced between the touch electrode layer and the cathode with unstable potential, which easily affects the touch performance of a touch anode layer. According to the embodiment, on the plane where the substrate is located, the auxiliary conductive portion is disposed in the gap region between adjacent blocky anodes, capacitance is formed between the auxiliary conductive portion and the cathode layer, so that the potential of the cathode layer is stabilized, and the problem of unstable cathode potential caused by a current between the anode and the cathode is effectively avoided. Therefore, the brightness of the display panel is kept stable, and the display quality of the display panel is improved.

Figure 5:
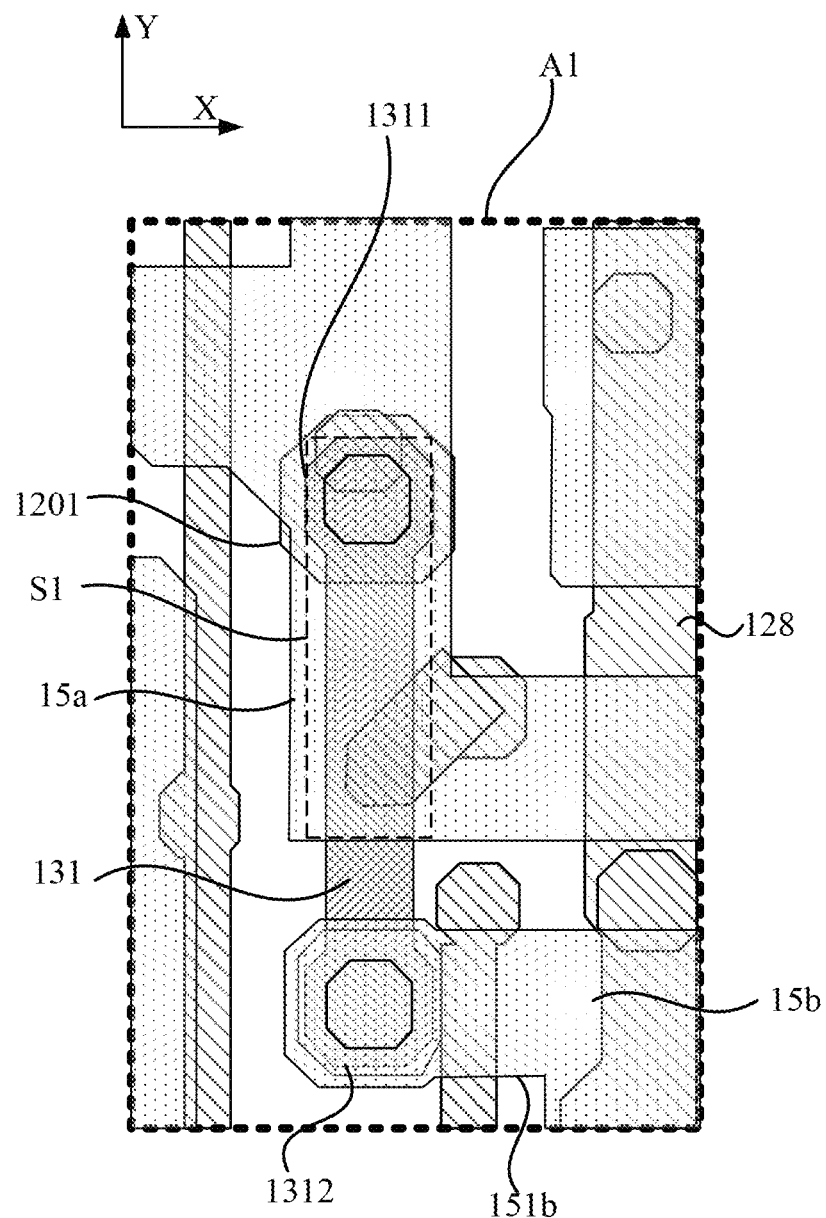
FIG. 5 is an enlarged structural view of a local region A1 of the display panel in FIG. 3.
Figure 6:
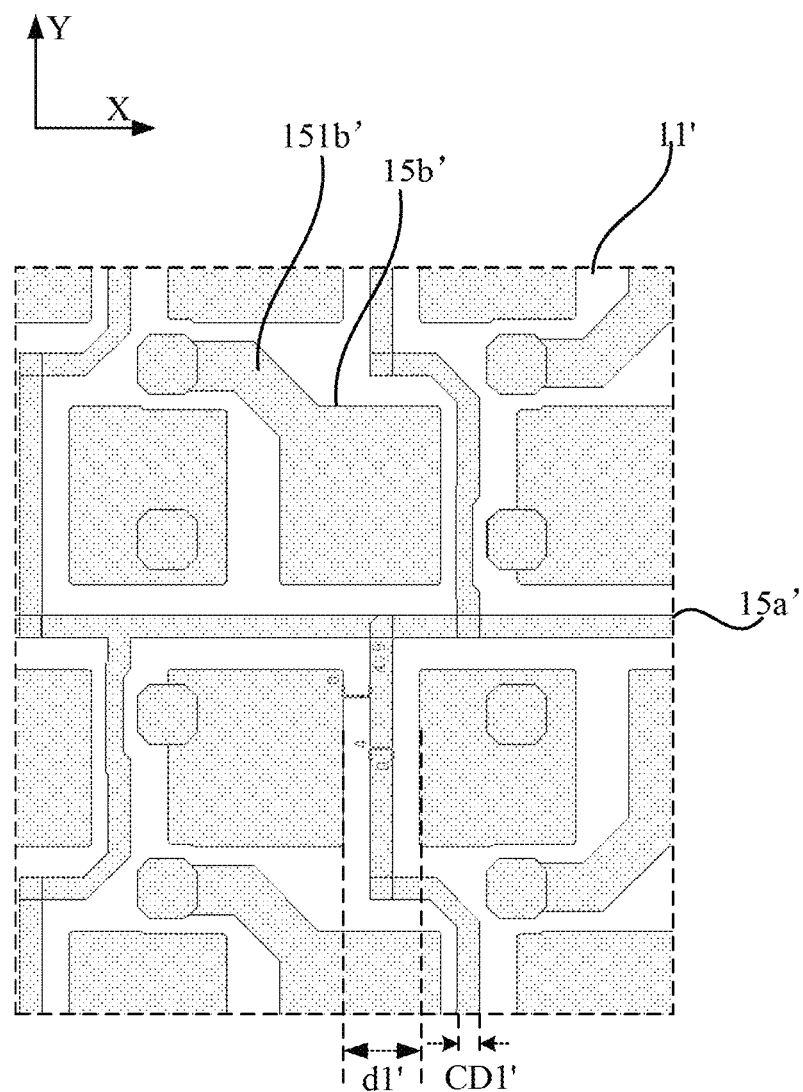
FIG. 6 is a top structural view of a comparative example of a display panel according to an embodiment of the present disclosure.

In an embodiment, the material of the auxiliary conductive portion 15a may generally include at least one of indium tin oxide or silver. However, for the above materials, a relatively small line width is technically difficult to achieve. Therefore, if the pixel density is relatively large, a relatively large process risk is easily to occur. For example, it is easily to cause a problem that the auxiliary conductive portion 15a cannot be connected or is easily broken due to a relatively small line width. On this basis, in order to maintain a high pixel density on the display panel and to ensure that a relatively wide range is reserved for the gap region d1, at least one jumper layer 13 may be disposed on a side of the auxiliary conductive portion 15a close to the substrate 11. The jumper layer 13 includes multiple jumper portions 131, and a blocky anode 15b is electrically connected to a drive module 120 corresponding to the blocky anode 15b through one jumper portion 131, so that the setting of a connection portion 151b extending from the blocky anode 15b is reduced (in the embodiment, the blocky anode 15b may include an anode body and a connection portion 151b extending from the anode body), and thus the connection portion 151b is prevented from occupying too much space of the gap region d1. In an embodiment, on the plane parallel to the plane where the substrate 11 is located, the auxiliary conductive portion 15a at least partially overlaps the multiple jumper portions 131. As shown in FIG. 5, FIG. 5 is an enlarged structural view of a local region A1 of the display panel in FIG. 3. An overlapped region exists between the auxiliary conductive portion 15a and the jumper portion 131, thus the connection portion 151b of the blocky anode 15b does not need to extend to the position at which the drive module is disposed, which is conductive to increasing the width of the gap region d1 between blocky anodes 15b to implement the layout of the auxiliary conductive portion 15a, and preventing the problem that the gap region d1 is too narrow to dispose the auxiliary conductive portion. In this way, the width of the auxiliary conductive portion 15a may be set to be slightly wider, so that the difficulty of the process of disposing the auxiliary conductive portion 15a is reduced, the process of manufacturing the display panel is accelerated, and the manufacturing quality of the display panel is improved. FIG. 6 is a top structural view of a comparative example of a display panel according to an embodiment of the present disclosure. In the comparative example, the above auxiliary conductive portion is not disposed, the drive modules are disposed in a matrix, and the blocky anodes 15b may be disposed in many different modes. For example, as shown in FIG. 6, the blocky anodes 15b' may be disposed in a triangle mode, so that part of the blocky anodes 15b' need to be provided with long connection portions 151b' for being connected to the corresponding drive modules. Therefore, a large space of the gap region d1' is occupied, the auxiliary conductive portion 15a' cannot be set to a relatively large width, and thus the process risk is relatively large.

The drive module layer includes a driver circuit formed by multiple metal layers and insulating layers. In an embodiment, with continued reference to FIG. 2, the drive module layer 12 includes: an active layer 122 disposed on the substrate 11; a gate electrode insulating layer 123 disposed on a side of the active layer 122 facing away from the substrate 11; a gate electrode layer 124 which is disposed on a side of the gate electrode insulating layer 123 facing away from the substrate 11 and is provided with a first capacitive electrode and a gate electrode of a drive module; a capacitive dielectric layer 125 disposed on a side of the gate electrode layer 124 facing away from the substrate 11; a capacitive electrode layer 126 which is disposed on a side of the capacitive dielectric layer 125 facing away from the substrate 11 and is provided with a second capacitive electrode; an interlayer insulating layer 127 disposed on a side of the capacitive electrode layer 126 facing away from the substrate 11; a source-drain electrode layer 128 which is disposed on a side of the interlayer insulating layer 127 facing away from the substrate 11 and is provided with a source electrode 1201 and drain electrode 1202 of the drive module 120; and a passivation layer 129 disposed on a side of the source-drain electrode layer 128 facing away from the substrate 11. In addition, a buffer layer 121 and the like may further be disposed between the substrate 11 and the active layer 122, or the drive module layer 12 may further include other metal layers or non-metal layers, which is not limited in the embodiment. It should be noted that in the top views of the display panel shown in FIG. 3 and FIG. 6, not entire film structure of the drive module layer 12 is illustrated. In order to obtain a clear relative relationship of the overlapping position between the auxiliary conductive portion and the jumper portion, only the source-drain electrode layer 128 of the drive module layer 12 is illustrated to characterize the position of the drive modules, and a relative positional relationship of the anode layer 15, the auxiliary conductive portion 15a and the jumper layer 13 is illustrated.

With continued reference to FIG. 3, in an embodiment, the drive modules may be disposed in a matrix. The drive modules are disposed in rows along a first direction X, and the drive modules are disposed in columns along a second direction Y; and the first direction X intersects the second direction Y. The blocky anodes 15b include a first blocky anode 152b, a second blocky anode 153b and a third blocky anode 154b which are disposed in a triangle mode; the first blocky anode 152b and the second blocky anode 153b in a same triangle are disposed in a column along the second direction Y; and the drive modules connected to blocky anodes 15b in a same triangle are disposed in a same row along the first direction X.

As mentioned above, FIG. 3 does not illustrate the complete structure of the drive module and only illustrates the source-drain electrode layer 128 including a data line 1281, a power signal line 1282, a source electrode 1201 and a drain electrode. Since the drive module is electrically connected to the blocky anode 15b through the source electrode 1201, the position of the drive module may be characterized by the position of the source electrode 1201 in FIG. 3. As shown in FIG. 2, the source electrodes 1201 of all drive modules may be disposed in a matrix along the first direction X and the second direction Y respectively. The first direction X is used as the row direction, the second direction Y is used as the column direction, and the first direction X intersects the second direction Y. In an embodiment, the first direction X and the second direction Y may be disposed perpendicular to each other, so that the drive modules are disposed in a matrix, but in the embodiment, the blocky anodes 15b are disposed in a triangle mode. In one embodiment, as shown in FIG. 3, the blocky anodes 15b include the first blocky anode 152b, the second blocky anode 153b and the third blocky anode 154b which are disposed in a triangle mode; the first blocky anode 152b and the second blocky anode 153b in a same triangle are disposed in a column along the second direction Y; and along the first direction X, the third blocky anode 154b is disposed at a position between the first blocky anode 152b and the second blocky anode 153b, forming a triangle shape. Referring to FIG. 3, the source electrodes 1201 of the drive modules connected to the blocky anodes 15b in a same triangle are disposed in a same row along the first direction X, that is, the drive modules connected to the blocky anodes 15b in a same triangle are disposed in a same row along the first direction X. It should be noted that the first blocky anode 152b and the second blocky anode 153b are disposed in a column along the second direction Y. If the drive module of the first blocky anode 152b and the drive module of the second blocky anode 153b are disposed in a same row, one of the first blocky anode 152b and the second blocky anode 153b needs to be connected to the corresponding drive module through a strip-shaped jumper portion 131. For example, the second blocky anode 153b shown in FIG. 3 is connected to the corresponding drive module through a jumper portion 131. In this embodiment, the jumper portion 131 is disposed, so that it is prevented that the second blocky anode 153b extends a relatively long connection portion 151b for being connected to the corresponding drive module, and the space of the gap region d1 is saved. Moreover, an overlapped region between the auxiliary conductive portion 15a and the jumper portion 131 exits, which is conductive to further increasing the width of the gap region d1 between the blocky anodes 15b to implement the layout of the auxiliary conductive portion 15a and reducing the difficulty of the process of disposing the auxiliary conductive portion 15a. In addition, the display quality is improved without sacrificing the pixel resolution while the width of the gap region d1 is increased.

In an embodiment, with continued reference to FIG. 3 and FIG. 5, a jumper portion 131 may include a first end 1311 and a second end 1312; the drive module is connected to a first end 1311 of a jumper portion 131 corresponding to the drive module; the blocky anode 15b is connected to a second end 1312 of a jumper portion 131 corresponding to the blocky anode 15b; a first end 1311 of at least one jumper portion does not overlap the blocky anode 15b; a first end 1311 of at least one jumper portion 131 overlaps the blocky anode 15b.

In this embodiment, the jumper portion 131 includes two connection ends connected to each other: the first end 1311 and the second end 1312. The drive module is connected to the first end 1311 of a jumper portion 131, and the corresponding blocky electrode 15b is connected to the second end 1312 of the jumper portion 131, so that an electrical connection is established between the drive module and the blocky anode 15b. As shown in FIG. 5, when the blocky anode 15b is relatively far away from the corresponding drive module, the blocky anode 15b may be connected to the corresponding drive module through an elongated jumper portion 131, so that a case where the first end 1311 of the jumper portion 131 does not overlap the blocky anode 15b exits, that is, a case of the setting of the local region A1 exits. In addition, as shown in a local region A2 in FIG. 3, a case where the blocky anode 15b is relatively close to the corresponding drive module exits in this embodiment, the drive module overlaps the blocky anode 15b, so that the first end 1311 of the corresponding jumper portion 131 overlaps the blocky anode 15b. In one embodiment, the first end 1311 of the jumper portion 131 may partially overlap the blocky anode 15b, as shown in a local region A3 in FIG. 3. Of course, on the plane where the substrate 11 is located, the blocky anode 15b may also completely overlap the first end 1311 of the jumper portion 131, as shown in the local region A2 in FIG. 3. In this embodiment, the arrangement of the blocky nodes 15b may be adapted to the arrangement of the drive modules according to the arrangement of the subpixels in a triangle or a rectangle, so that the corresponding drive modules and the blocky anodes 15b are connected through the jumper portions 131. Therefore, it is avoided that the blocky anode 15b extends a relatively long connection portion 151b, the area of the gap region d1 is increased, the layout of the auxiliary conductive portion is facilitated, the difficulty of the process of disposing the auxiliary conductive portion on the display panel with the subpixels disposed in a triangle is reduced, the cathode potential is maintained to be stable, and the display quality is improved.

With continued reference to FIG. 2, in an embodiment, at least one blocky anode 15b is electrically connected to a second end 1312 of a jumper portion 131, which is corresponding to the blocky anodes 15b, of the jumper layer 13 through a first through hole K1 penetrating through the first auxiliary layer 14. A vertical projection of the first through hole K1 on the plane where the substrate 11 is located is located within a blocky anode 15b corresponding to the first through hole K1.

FIG. 2 is a sectional view taken along a segment C-C' of the display panel in FIG. 3. As can be seen from FIG. 2, the blocky anode 15b may be electrically connected to the second end 1312 of the corresponding jumper portion 131 through the first through hole K1 penetrating through the first auxiliary layer 14. As can be seen from FIG. 3, the first through hole K1 is overlapped by the corresponding blocky anode 15b on the plane where the substrate 11 is located, so that the first through hole K1 does not occupy the space of the gap region, which is conductive to implementing the layout of the auxiliary conductive portion in the gap region and improving the process quality of the auxiliary conductive portion.

Figure 7:
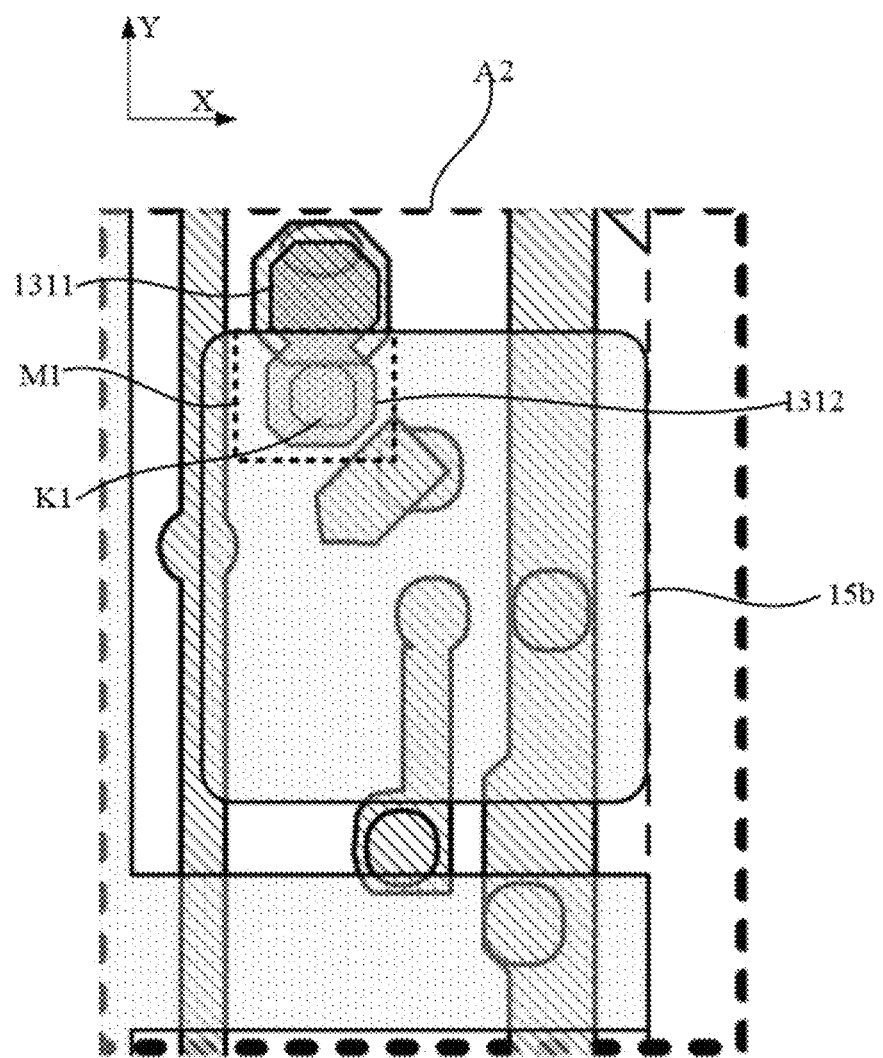
FIG. 7 is a partial view of a top view of another display panel according to an embodiment of the present disclosure.

FIG. 7 is a partial view of a top view of another display panel according to an embodiment of the present disclosure. In an embodiment, on the plane parallel to the plane where the substrate 11 is located, at least one blocky anode 15b is a polygon. The vertical projection of the first through hole K1 on the plane where the substrate 11 is located is within a first connection region M1; and the first connection region M1 is a region, within the polygon, which is closest to the first end 1311 of the jumper portion 131.

Referring to FIG. 3 and FIG. 7, the blocky anode 15b may be a rectangle. Of course, the blocky anode 15b in the embodiment may also be rhombuses, circles, ellipses, polygons and the like, which is not limited in the embodiment. In an embodiment, as shown in FIG. 7, the blocky anode 15b is a rounded rectangle, so that the manufacturing process is simple, rigid cracking is not easily to occur, and the quality of the manufactured panel is improved. As shown in FIG. 7, on the plane where the substrate 11 is located, the first through hole K1 is overlapped by the blocky anode 15b, and the first through hole K1 is located within the first connection region M1 within the blocky anode 15b. In this embodiment, the first connection region M1 is a region, within the polygonal blocky anode 15b, which is closest to the first end 1311 of the jumper portion 131 in a straight line. The first through hole K1 is disposed in the above first connection region M1, so that the jumper portion 131 may further be disposed only in the first connection region M1, and the first connection region M1 is closest to the first end 1311 of the jumper portion 131 in a straight line. The length and area of the jumper portion 131 are minimized, capacitance between the jumper portion 131 and the anode layer 15 is avoided, thus the impact on the potential of the anode layer 15 is avoided, accurate dimming on the subpixels by the anode potential of the anode layer 15 is achieved, and the display quality is improved.

With continued reference to FIG. 3, as shown in the local region A2, in an embodiment, a vertical projection of at least one jumper portion 131 on the plane where the substrate 11 is located is located within the corresponding blocky anodes 15b. In the way, on the plane where the substrate 11 is located, the first end 1311 and second end 1312 of the jumper portion 131 are overlapped by the corresponding blocky anodes 15b, so that the first end 1311 and second end 1312 of the jumper portion 131 do not occupy the area of the gap region d1 between the blocky anodes 15b, thus the auxiliary conductive portions 15a can be arranged relatively dense, and the stability of the potential of the cathode layer 152 of the display panel is further improved. In addition, whether corresponding to the drive module or not, the blocky anode 15b may be provided with a structure for being connected through the jumper portion 131, so that it is avoided that the resistance difference between different anodes and connection sections of the drive modules is too large, and the consistency of the electrical performance is effectively improved.

In an embodiment, the auxiliary conductive portion may further be used as an initialization signal line of the drive module. In order to form capacitance with the cathode layer, the auxiliary conductive portion needs to be connected to a fixed potential. Exemplarily, the auxiliary conductive portion may be connected to a zero potential or directly connected to a ground terminal of the display panel. In this embodiment, different fixed potentials may be selected for the auxiliary conductive portion 15a, and the embodiment does not limit the specific potential. The drive module in the embodiment generally includes an initialization unit, a reset unit, a data write unit, a drive unit and a light-emitting control unit. The data write unit is configured to write a data voltage into the drive unit in a data write stage; the reset module is configured to provide a reset signal to a light-emitting element; and the drive unit is configured to drive the light-emitting control unit according to the data voltage. The drive module needs to be connected with a data line, an initialization signal line, a gate line, a light-emitting control signal line and the like. In the embodiment, the auxiliary conductive portion may be led to the drive module layer through a via to be used as the initialization signal line and be electrically connected to the initialization unit, so that the wiring arrangement of the drive module is saved, and the manufacturing process of the display panel is simplified.

Figure 8:
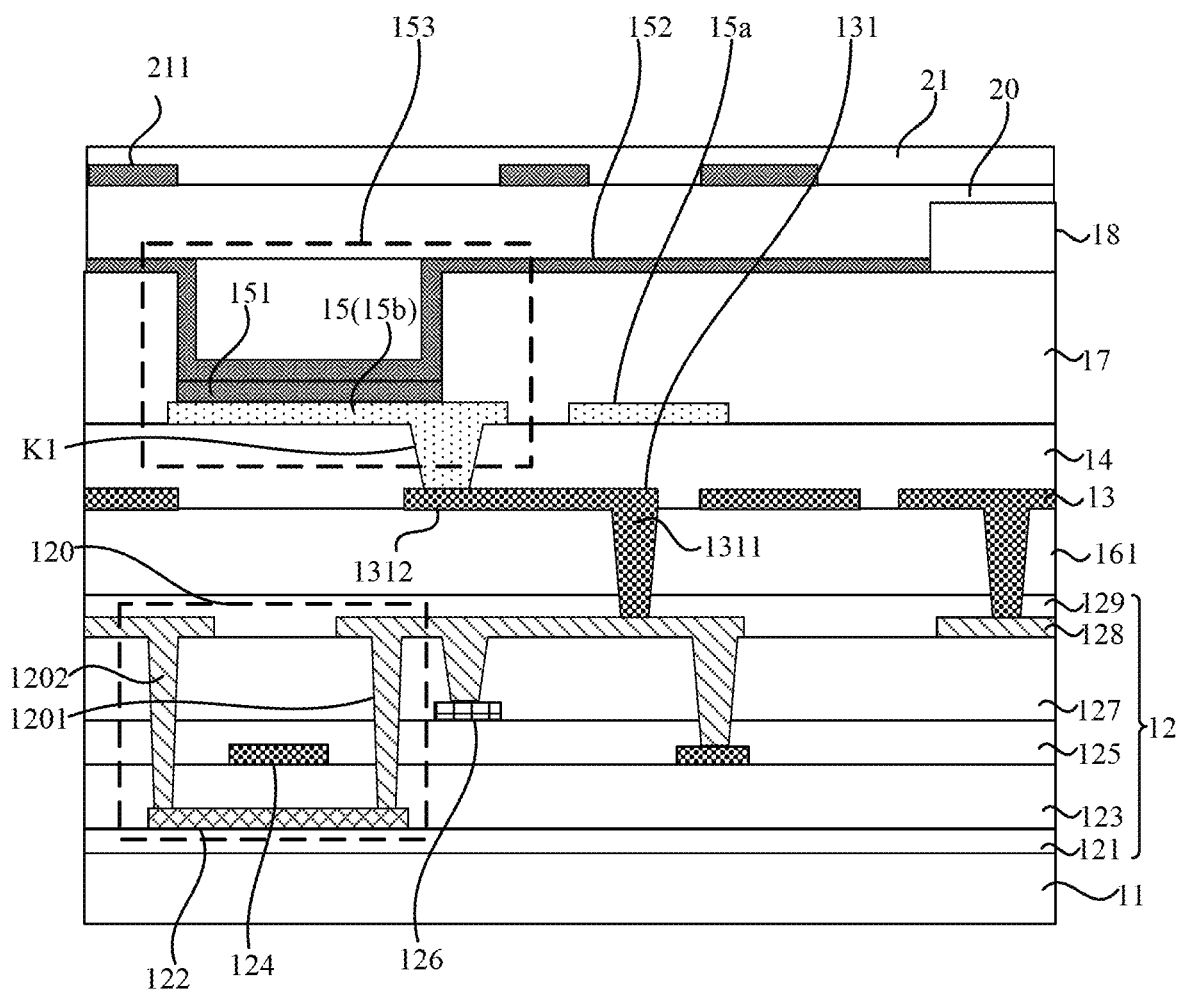
FIG. 8 is a structural view of another display panel according to an embodiment of the present disclosure.

FIG. 8 is a structural view of another display panel according to an embodiment of the present disclosure. In an embodiment, the display panel may further include an encapsulation layer 20 and a touch layer 21. The encapsulation layer 20 is disposed on a side of the cathode layer 152 facing away from the substrate 11; and the touch layer 21 is disposed on a side of the encapsulation layer 20 facing away from the substrate 11. The touch layer 21 includes a metal grid structure; on the plane parallel to the plane where the substrate 11 is located, the metal grid structure is disposed between the blocky anodes 15b and overlaps the auxiliary conductive portion 15a.

In this embodiment, the display panel may be a touch display panel, for example, a display panel in the form of a TPOT. As shown in FIG. 8, on the basis of the structure of the display panel in FIG. 2, the display panel may further be provided with the encapsulation layer 20 and the touch layer 21 sequentially on the cathode layer 152, and the touch layer 21 may include touch electrodes 211 disposed in an array, and the touch electrodes 211 in this embodiment may be composed of the metal grid structure.

In one embodiment, a touch electrode 211 includes multiple metal wires, and the metal wires cross each other to form metal grids. On the plane parallel to the plane where the substrate 11 is located, the metal grids are located between adjacent blocky anodes 15b to avoid blocking the light emitted by the subpixels, that is, meshes of the metal grids corresponds to the openings of a subpixel definition layer. In addition, on the plane parallel to the plane where the substrate 11 is located, the metal grid structure at least partially overlaps the auxiliary conductive portion 15a. In this embodiment, a vertical projection of the auxiliary conductive portion 15a on the substrate 11 may be disposed to completely overlap the metal grid structure. Therefore, the auxiliary conductive portion 15a serves as a metal shielding layer, so that the impact of the metal grid structure on a metal-material layer of the drive module layer can be effectively prevented. In addition, the auxiliary conductive portion 15a in the embodiment may correspond to the path of the grid line of the touch electrode 211, which saves space and minimizes the parasitic capacitance between layers.

Figure 9:
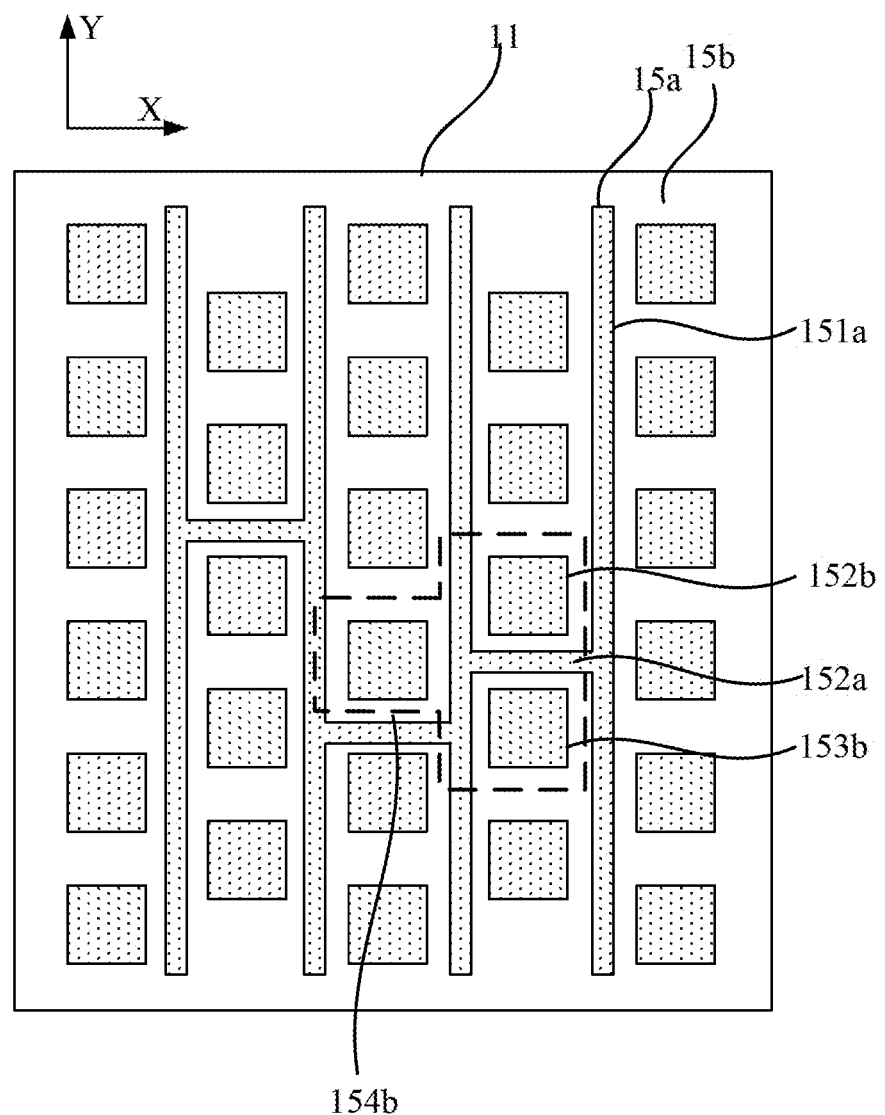
FIG. 9 is a top structural view of another display panel according to an embodiment of the present disclosure.

FIG. 9 is a top structural view of another display panel according to an embodiment of the present disclosure. In an embodiment, the auxiliary conductive portion 15a may include multiple first auxiliary conductive portion segments 151a extending along the second direction Y; and on the plane parallel to the plane where the substrate 11 is located, a first auxiliary conductive portion segment 151a is disposed between adjacent two columns of blocky anodes 15b. Adjacent two first auxiliary conductive portion segments 151a are connected through a second auxiliary conductive portion segment 152a; and on the plane parallel to the plane where the substrate 11 is located, the second auxiliary conductive portion segment 152a is disposed between a first blocky anode 152b and a second blocky anode 153b which are adjacent to each other or between adjacent two third blocky anodes 154b.

In this embodiment, the auxiliary conductive portion 15a may include multiple first auxiliary conductive portion segments 151a extending along a same direction, and adjacent two first auxiliary conductive portion segments 151a may be connected through a second auxiliary conductive portion segment 152a. As shown in FIG. 9, the first auxiliary conductive portion segment 151a may extend along the second direction Y, and the first auxiliary conductive portion segment 151a is disposed between adjacent two columns of blocky anodes 15b. The second auxiliary conductive portion segment 152a may extend along the first direction X and is disposed between adjacent two rows of blocky anodes 15b. The blocky anodes illustrated in FIG. 9 are disposed in triangles. Therefore, on the plane where the substrate 11 is located, the second auxiliary conductive portion segment 152a is disposed between a first blocky anode 152b and a second blocky anode 153b which are adjacent to each other, or the second auxiliary conductive portion segment 152a is disposed between adjacent two third blocky anodes 154b. The auxiliary conductive portions 15a shown in FIG. 9 have a simple layout structure, and the auxiliary conductive portions 15a are evenly distributed on the display panel, so that it is easy to form a uniform capacitive electrode layer on the entire plane parallel to the plane where the substrate 11 is located.

Figure 10:
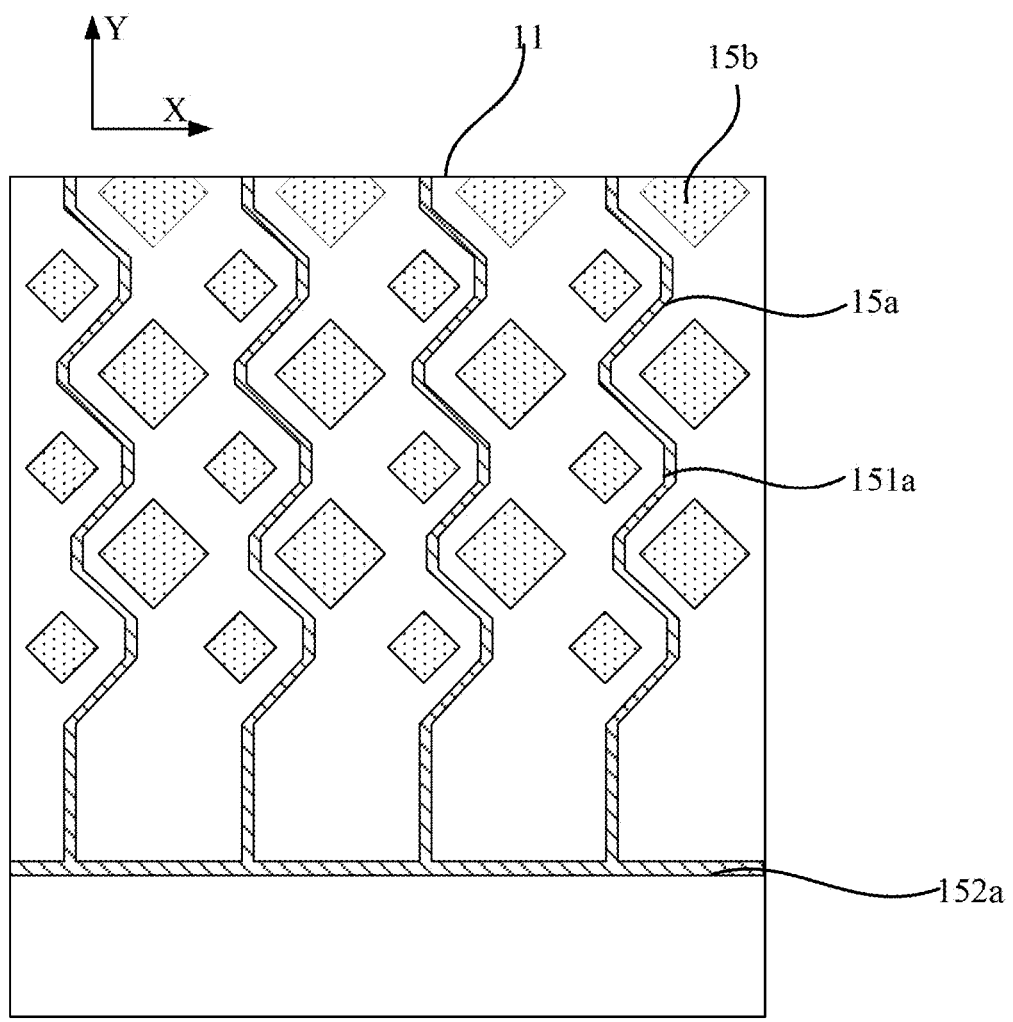
FIG. 10 is a top structural view of another display panel according to an embodiment of the present disclosure.

Referring to FIG. 10, FIG. 10 is a top structural view of another display panel according to an embodiment of the present disclosure. The blocky anodes 15b may be rectangles shown in FIG. 9, or may be rhombuses shown in FIG. 10. The rhombic blocky anodes 15b may further be disposed in triangles, so that the auxiliary conductive portion 15a may include multiple first auxiliary conductive portion segments 151a extending along the second direction Y. The first auxiliary conductive portion segments 151a are disposed to match the rhombic blocky anodes 15b and may be curvilinear as shown in FIG. 10, but the curvilinear first auxiliary conductive portion segments 151a extend in a same direction. Moreover, in this embodiment, a second auxiliary conductive portion segment 152a extending along the first direction X is disposed on an edge of the blocky anode 15b. The second auxiliary conductive portion segment 152a serves as a bus to connect the multiple first auxiliary conductive portion segments 151a. The auxiliary conductive portions 15a shown in FIG. 10 have a simple layout structure, and the auxiliary conductive portions 15a are evenly distributed on the display panel, so that it is easy to form a uniform capacitive electrode layer on the entire plane parallel to the plane where the substrate 11 is located.

With continued reference to FIG. 3, in an embodiment, the auxiliary conductive portion 15a may be a network structure; and a vertical projection of the blocky anode 15b on the plane where the substrate 11 is located is located within a mesh of the network structure. The auxiliary conductive portion 15a may be disposed in the gap region d1 around the blocky anodes 15b and form a network structure around the blocky anodes 15b, so that the uniformity of the distribution of the auxiliary conductive portion 15a is further improved, and the auxiliary conductive portion 15a has a relatively large area directly facing the cathode layer, which is conducive to maintaining the stability of the cathode potential and improving the display efficiency of the display panel.

In an embodiment, with continued reference to FIG. 3, the anode layer 15, the organic light-emitting layer 151 and the cathode layer 152 may form a subpixel 153; and the display panel may include subpixels 153 of different colors; and on the plane parallel to the plane where the substrate 11 is located, at least part of subpixels 153 of a same color has a same first overlapped area; a first overlapped area of a subpixel 153 is an overlapped area of a jumper portion 131 and an auxiliary conductive portion 15a within a same subpixel 153.

As shown in FIG. 3, the display panel may include multiple subpixels 153 of different colors. For example, the subpixels 153 may include red subpixels, green subpixels, blue subpixels and the like. For example, among the blocky anodes 15 disposed in a triangle mode provided by the above embodiments, the first blocky anode 152b, the second blocky anode 153b, and the third blocky anode 154b may be sequentially used as a blocky anode of a red subpixel, a blocky anode of a green subpixel and a blocky anode of a blue subpixel. It can be seen from FIG. 5 that an overlapped area between a jumper portion 131 corresponding to the part of subpixels and the auxiliary conductive portion 15a is S1. In this embodiment, the overlapped area between the jumper portion 131 of the subpixel 153 and the corresponding auxiliary conductive portion 15a is defined as a first overlapped area, so that in the embodiment, the wiring of the auxiliary conductive portions 15a may be arranged to enable that at least part of the subpixels 153 of a same color has a same first overlapped area. Therefore, even if the capacitance between the auxiliary conductive portion 15a and the cathode layer 152 has an impact on the emission brightness of the subpixels 153, for example, the emission brightness of the subpixels 153 is lower than a set value, since the subpixels 153 of a same color has a same overlapped area between the jumper portion 131 and the auxiliary conductive portion 15a, the capacitance has a same impact on the emission brightness of the subpixels 153 of a same color, and the emission brightness may be compensated by adjusting gamma. In this way, the cathode potential is ensured to be stable, the error of brightness adjustment of the subpixels is reduced, and the color cast of the display picture is effectively avoided.

It should be noted that the above embodiments illustrate only the relative positions of the auxiliary conductive portion and the blocky anodes on the plane where the substrate is located, and do not limit the film layer on which the auxiliary conductive portion is disposed. In an embodiment, the auxiliary conductive portion may be disposed in a same layer as the blocky anodes, or may be disposed in a film layer between the blocky anodes and the cathode layer to form a capacitance with the cathode layer.

Referring to FIG. 3, the auxiliary conductive portion 15a may be disposed in the anode layer, that is, the auxiliary conductive portion 15a may be disposed in a same layer as the blocky anodes 15b; a material of the auxiliary conductive portion 15a is at least one of molybdenum or titanium; and a material of the blocky anodes 15b is at least one of indium tin oxide or silver. In this embodiment, although the auxiliary conductive portion 15a is disposed in a same layer as the blocky anodes 15b, the metal material of the auxiliary conductive portion 15a is different from the metal material of the blocky anodes 15b. The material of the blocky anodes 15b is at least one of indium tin oxide or silver, and the material of the auxiliary conductive portion 15a is at least one of molybdenum or titanium. Therefore, two metal etching processes are required in the manufacturing process. In an embodiment, the auxiliary conductive portion 15a and the blocky anodes 15b may be separately formed by a wet etching process, and the auxiliary conductive portion 15a is formed before the blocky anodes 15b. For example, the blocky anodes 15b may be made of an interlayer metal of indium tin oxide, silver and indium tin oxide, and the auxiliary conductive portion 15a needs to be made of a metal insensitive to the above etching solution, such as at least one of molybdenum or titanium mentioned above. It should be noted that since the silver material in the blocky anodes 15b is easily corroded and oxidized, a metal film layer of molybdenum and titanium is formed first, and then the metal film layer is subjected to wet etching to obtain the structure of the auxiliary conductive portion 15a; thereafter, an interlayer metal of indium tin oxide, silver and indium tin oxide may be formed, and then the shape and structure of the blocky anodes 15b may be etched by an etching solution. Since the etching solution should not affect the auxiliary conductive portion 15a, the material of the auxiliary conductive portion 15a should be different from the material of the blocky anodes 15b, so that a metal insensitive to the etching solution, such as molybdenum, titanium mentioned above and the like, is required. In the embodiment, different procedures are adopted for the auxiliary conductive portion 15a and the blocky anodes 15b through two metal etching processes, so that the size of the auxiliary conductive portion 15a, such as the line width, and the size of the blocky anodes 15b and the like may be adjusted in the separate procedures. For example, the line width of the auxiliary conductive portion 15a may be set to be slightly wider, or the area of the blocky anode 15b may be set to be relatively large. Through the above two-time metal etching process, the room for the adjustment of the processes of the auxiliary conductive portion 15a and the blocky anodes 15b is increased, which is conductive to achieving the rational layout of the auxiliary conductive portion 15a and the blocky anodes 15b.

With continued reference to FIG. 3, the auxiliary conductive portion 15a may be disposed in a same layer as the blocky anodes 15b, and the material of the auxiliary conductive portion 15a is the same as the material of the blocky anodes 15b. In the embodiment, the auxiliary conductive portion 15a and the blocky anodes 15b may also be manufactured by a same process, and thus the material of the auxiliary conductive portion 15a is the same as the material of the blocky anodes 15b. Exemplarily, at least one of indium tin oxide or silver may be used. In the embodiment, through the process of disposing the auxiliary conductive portion 15a and the blocky anodes 15b in a same layer, one metal etching process can be saved, the manufacturing process of the display panel can be simplified, and the manufacturing efficiency of the display panel can be improved. As shown in FIG. 5, in the embodiment, a distance between an edge of the auxiliary conductive portion 15a and an edge of an adjacent blocky anode 15b is less than or equal to 5 μm. Due to the setting of the jumper layer 13, the setting of the connection portions 151b of the blocky anodes 15b may be greatly reduced, the space of the gap region d1 is saved, and the width CDI of the auxiliary conductive portion 15a may be set relatively large than that of a display panel without disposing the jumper layer 13. In one embodiment, if the distance between adjacent blocky anodes 15b is larger than 13 μm, the distance between an edge of the auxiliary conductive portion 15a and an edge of an adjacent blocky anode 15b is controlled to be less than or equal to 5 μm to prevent a case of a short circuit or an open circuit. Referring to FIG. 6, no jumper layer is disposed in FIG. 6, so that the width CDI' of the auxiliary conductive portion 15a' is less than the width CDI of the auxiliary conductive portion 15a. Compared with the comparative example shown in FIG. 6, in this embodiment, the width CDI of the auxiliary conductive portion 15a may be increased to multiple times, so that the difficulty of the manufacturing process of the auxiliary conductive portion 15a is reduced, the auxiliary conductive portion 15a is prevented from being broken during the manufacturing process, and the reliability of manufacturing the display panel is improved.

Figure 11:
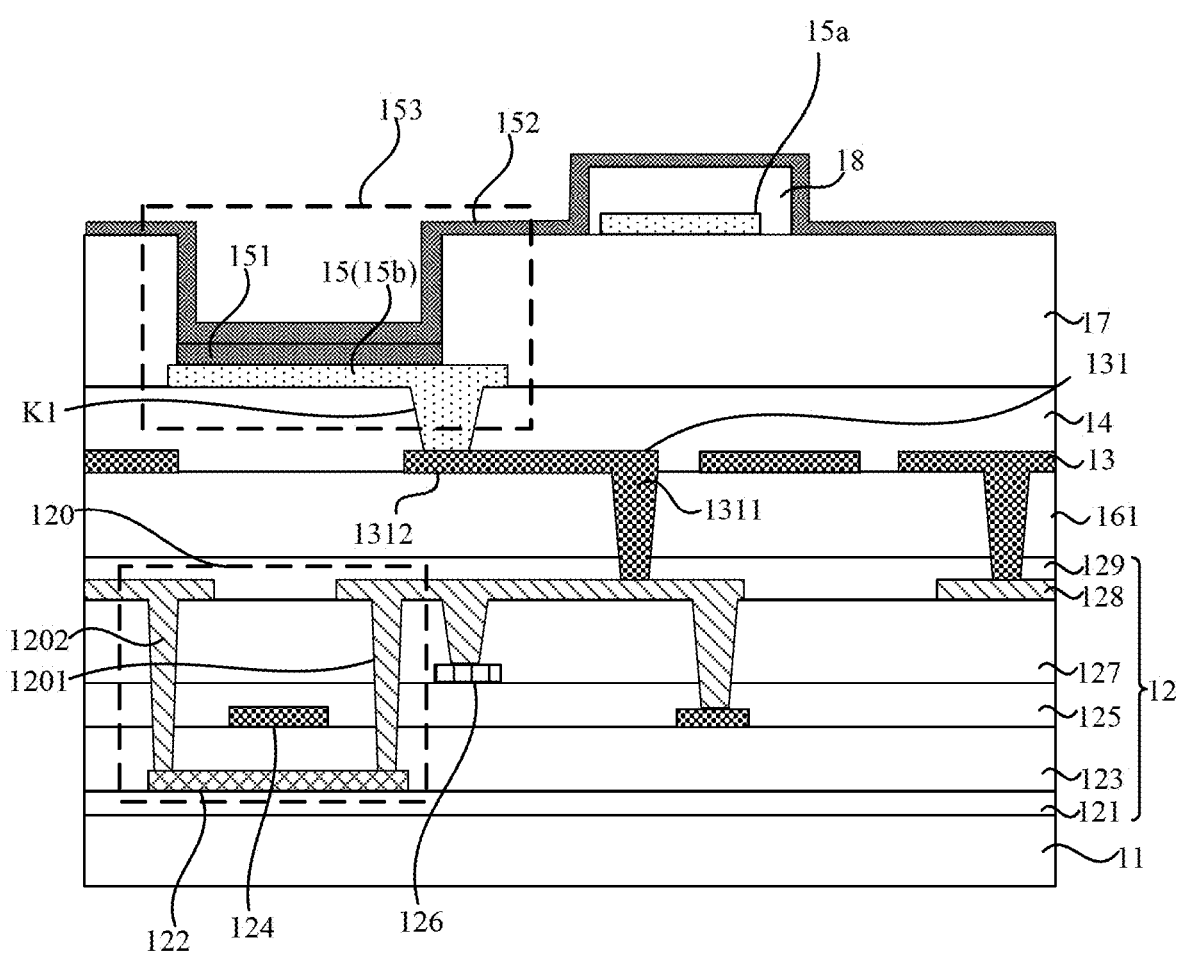
FIG. 11 is a structural view of another display panel according to an embodiment of the present disclosure.

In addition, the auxiliary conductive portion 15a and the blocky anodes 15b may be respectively disposed in different film layers. FIG. 11 is a structural view of another display panel according to an embodiment of the present disclosure. In an embodiment, the display panel may further include a pixel definition layer 17 and a support pole 18. The pixel definition layer 17 is disposed between the anode layer 15 and the organic light-emitting layer 151; the support pole 18 is disposed between the pixel definition layer 17 and the organic light-emitting layer 151; and a vertical projection of the support pole 18 on the plane where the substrate 11 is located is located within the pixel definition layer 17. The auxiliary conductive portion 15a is disposed between the pixel definition layer 17 and the support pole 18; and the vertical projection of the support pole 18 on the plane where the substrate 11 is located completely overlaps the auxiliary conductive portion 15a. The auxiliary conductive portion 15a is disposed between the pixel definition layer 17 and the support pole 18, so that the blocky anodes 15b and the auxiliary conductive portion 15a can be effectively isolated, and mutual impact between signals of the blocky anodes 15b and signals of the auxiliary conductive portion 15a is avoided.

Figure 12:
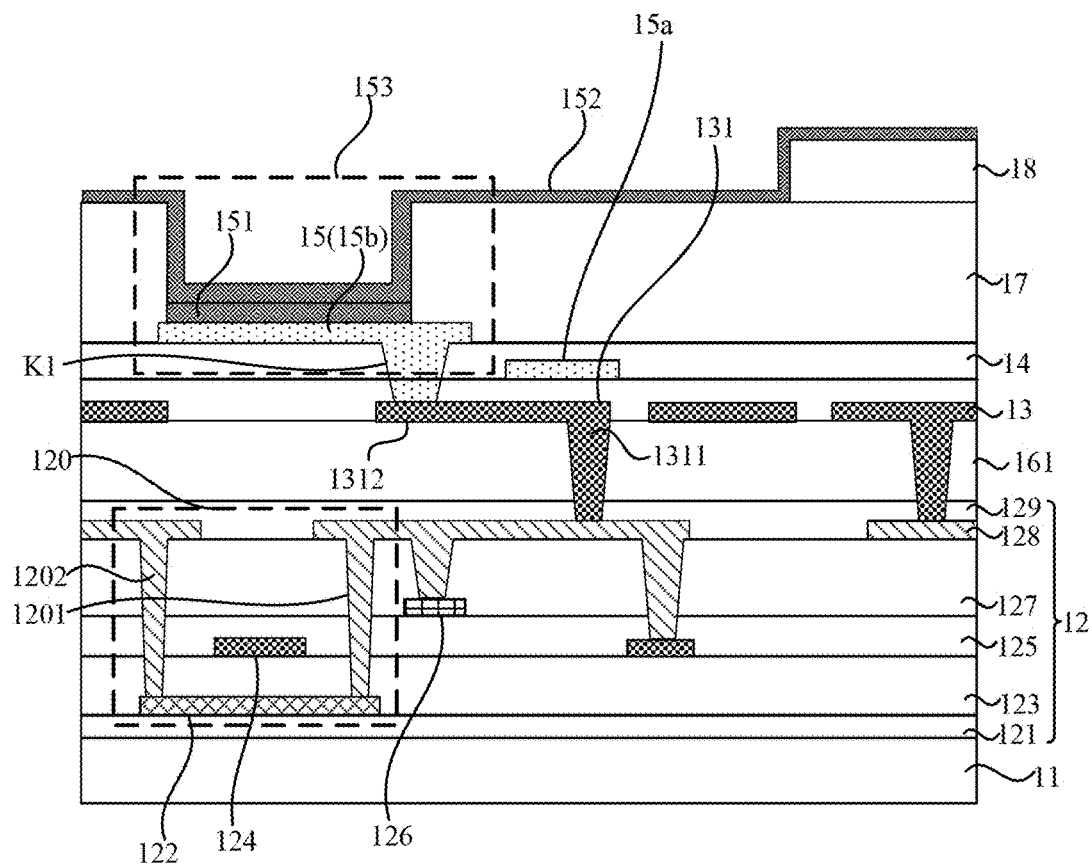
FIG. 12 is a structural view of another display panel according to an embodiment of the present disclosure.

In addition, as shown in FIG. 12, FIG. 12 is a structural view of another display panel according to an embodiment of the present disclosure. The auxiliary conductive portion 15a may further be disposed in a different layer from the blocky anodes 15b. The auxiliary conductive portion 15a may be disposed in a conductive layer on a side of the blocky anodes 15b close to the substrate 11. The blocky anode 15b avoids the auxiliary conductive portion 15a through the connection portion 131, so that it is avoided that an overlapped area between the blocky anodes 15b and the auxiliary conductive portion 15a exits on the plane where the substrate 11 is located and that signals of the blocky anodes 15b and signals of the auxiliary conductive portion 15a affect each other.

Referring to FIG. 3 and FIG. 11, the display panel may further include the pixel definition layer 17 and the support pole 18. After the anode layer 15 is formed, the pixel definition layer 17 is disposed on a side of the anode layer 15 facing away from the substrate 11, and the support pole 18 is disposed on a side of the pixel definition layer 17 facing away from the substrate 11, and a vertical projection of the support pole 18 on the plane where the substrate 11 is located is located within the pixel definition layer 17. Then, the organic light-emitting layer 151 and the cathode layer 152 are sequentially disposed on a side of the support pole 18 facing from the substrate 11. As shown in FIG. 3, the auxiliary conductive portion 15a is disposed in the anode layer 15, and in the embodiment, the auxiliary conductive portion 15a is disposed on a side of the anode layer 15 close to the cathode layer 152. As shown in FIG. 11, the auxiliary conductive portion 15a may be disposed between the pixel definition layer 17 and the support pole 18, and the support pole 18 may completely overlap the auxiliary conductive portion 15a to achieve the insulation between the auxiliary conductive portion 15a and the cathode layer 152. In this way, the auxiliary conductive portion 15a and the cathode layer 152 form the capacitance to stabilize the cathode potential. Moreover, due to the setting of the jumper layer 13, the setting of the connection portion 151b in the gap region d1 on the anode layer 15 is greatly reduced, and the auxiliary conductive portion 15a overlapping the jumper layer 13 is not disposed in the anode layer 15, so that the size the blocky anode 15b may be appropriately increased according to the size of the gap region d1, and increasing the light-emitting area of the entire display panel is increased and the flat display ration of the display panel is increased.

In an embodiment, a distance between an edge of the auxiliary conductive portion 15a and an edge of the pixel definition layer is less than or equal to 3 μm. Since the auxiliary conductive portion 15a is not disposed in the anode layer 15, the size of the auxiliary conductive portion 15a may be set as wide as possible on the premise that the size of the auxiliary conductive portion 15a is less than the width of the gap region d1 between the blocky anodes 15b. For example, the projection of the auxiliary conductive portion 15a may partially overlap the blocky anodes 15b, so that the area directly facing the blocky anode 15b and the cathode layer 152 is increased, the capacitance between the auxiliary conductive portion 15a and the cathode layer 152 is increased, and the stability of the potential of the cathode layer 152 is improved.

Figure 13:
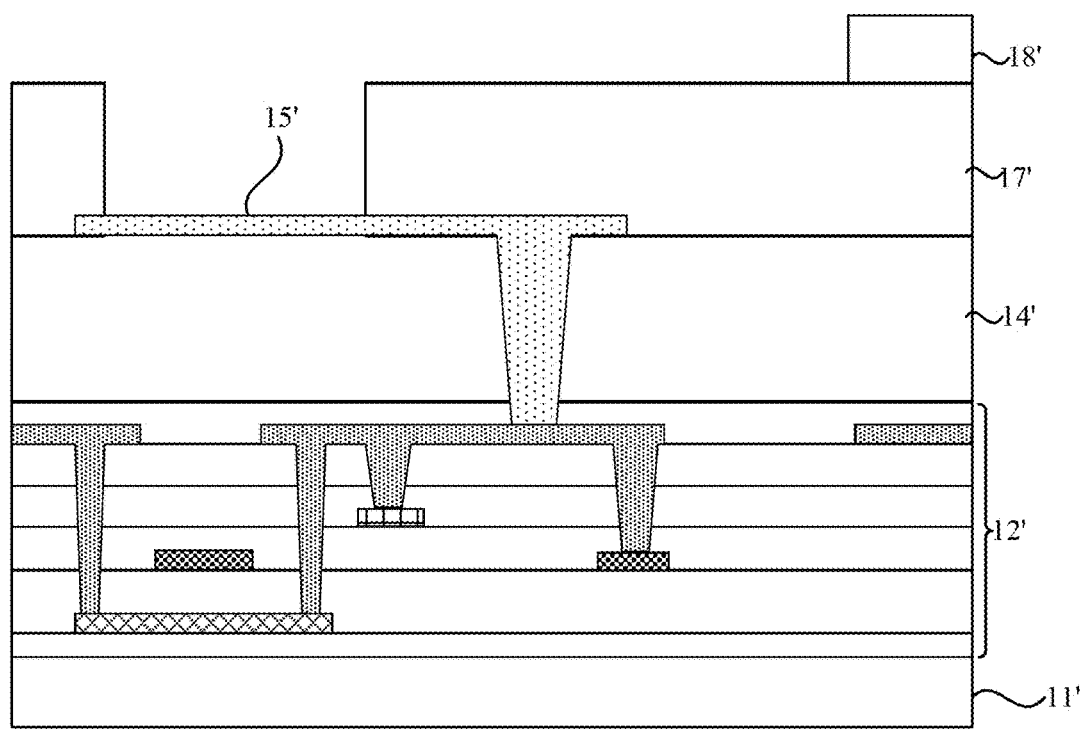
FIG. 13 is a structural view of another comparative example of a display panel according to an embodiment of the present disclosure.

In this embodiment of the present disclosure, at least one jumper layer 13 may be disposed. As shown in FIG. 3, one jumper layer 13 may be disposed. In an embodiment, a first jumper layer 13a may be disposed between the drive module layer 12 and the first auxiliary layer 14. A first insulating dielectric layer 161 is disposed on a side of the drive module layer 12 facing away from the substrate 11; the first jumper layer 13a is disposed on a side of the first insulating dielectric layer 161 facing away from the substrate 11; and the first jumper layer 13a includes multiple first jumper portions 131a. The blocky anode 15b is connected to a first jumper portion 131a corresponding to the blocky anode 15b through a first through hole K1 penetrating through the first auxiliary layer 14; and the first jumper portion 131a is electrically connected to a drive module 120 corresponding to the first jumper portion 131a through a second through hole K2 penetrating through the first insulating dielectric layer 161. In this embodiment of the present disclosure, one jumper layer 13 may be disposed. In one embodiment, the first jumper layer 13a may be disposed between the drive module layer 12 and the first auxiliary layer 14. The first insulating dielectric layer 161 is disposed between the first jumper layer 13a and the drive module layer 12. The first jumper layer 13a includes multiple first jumper portions 131a. The blocky anode 15b is connected to a first jumper portion 131a corresponding to the blocky anode 15b through a first through hole K1 penetrating through the first auxiliary layer 14; and the first jumper portion 131a is electrically connected to a drive module 120 corresponding to the first jumper portion 131a through a second through hole K2 penetrating through the first insulating dielectric layer 161. Referring to FIG. 13, FIG. 13 is a structural view of another comparative example of a display panel according to an embodiment of the present disclosure. In FIG. 13, the comparative example is not provided with the jumper layer 13, and the substrate 11' is sequentially provided with the drive module layer 12', the first auxiliary layer 14', the anode layer 15', the pixel definition layer 17' and the support pole 18'. Compared with the display panel in the comparative example, according to the display panel provided in the embodiment, the setting of the connection portions of the blocky anodes in the anode layer 15 can be reduced, which is conducive to disposing the auxiliary conductive portion 15a in the gap region between the blocky anodes to form stable capacitance with the cathode layer. Therefore, the display quality of the display panel is improved, and the touch accuracy of the display panel integrated with a touch function is improved.

Figure 14:
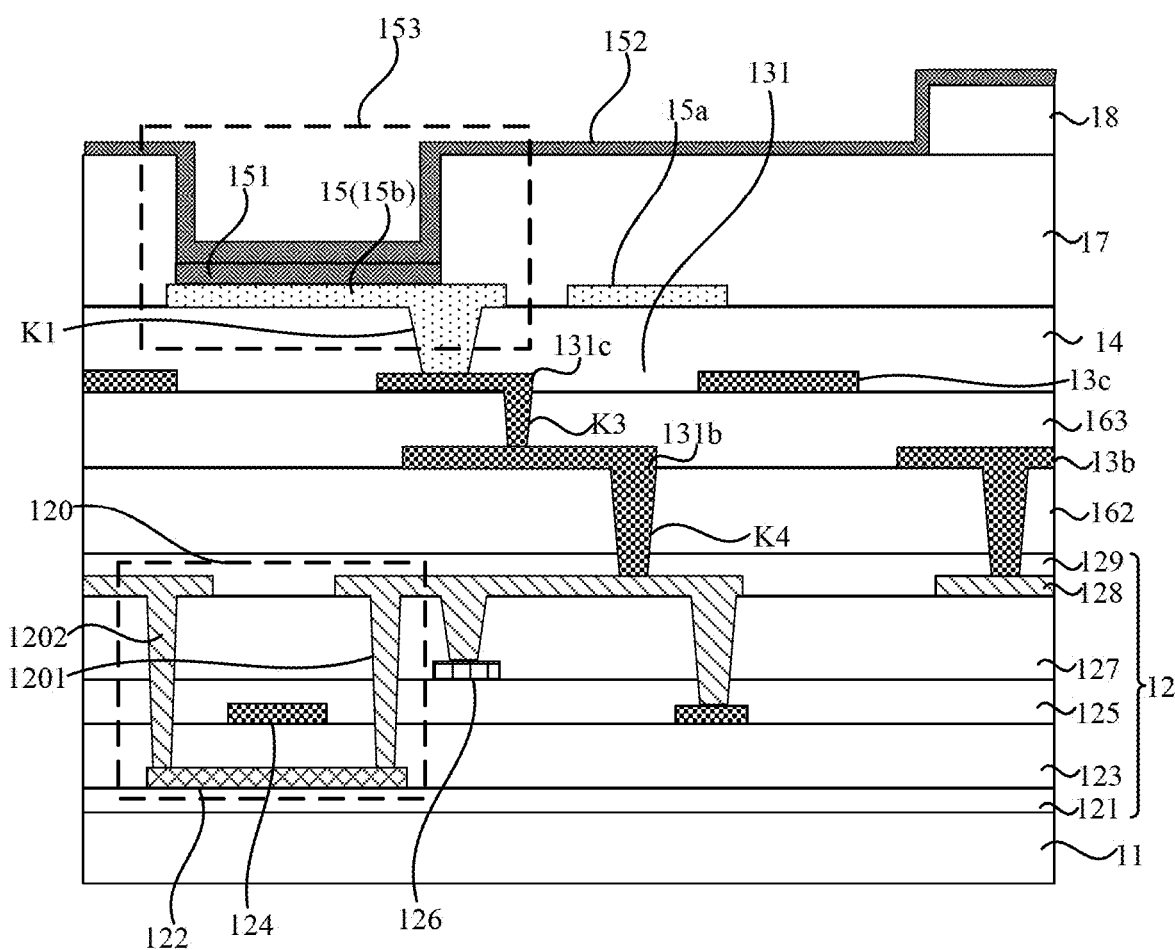
FIG. 14 is a structural view of another display panel according to an embodiment of the present disclosure.

FIG. 14 is a structural view of another display panel according to an embodiment of the present disclosure. In an embodiment, a second jumper layer 13b and a third jumper layer 13c may be disposed between the drive module layer 12 and the first auxiliary layer 14. A second insulating dielectric layer 162 is disposed on the side of the drive module layer 12 facing away from the substrate 11; the second jumper layer 13b is disposed on a side of the second insulating dielectric layer 162 facing away from the substrate 11, and the second jumper layer 13b includes multiple second jumper portions 131b. A third insulating dielectric layer 163 is disposed on a side of the second jumper layer 13b facing away from the substrate 11; and the third jumper layer 13c is disposed on a side of the third insulating dielectric layer 163 facing away from the substrate 11, and the third jumper layer 13c includes multiple third jumper portions 131c. The blocky anode 15b is connected to a third jumper portion 131c corresponding to the blocky anode 15b through a first through hole K1 penetrating through the first auxiliary layer 14; the third jumper portion 131c is connected to a second jumper portion 131b corresponding to the third jumper portion 131c through a third through hole K3 penetrating through the third insulating dielectric layer 163; and the second jumper portion 131b is electrically connected to a drive module 120 corresponding to the second jumper portion 131b through a fourth through hole K4 penetrating through the second insulating dielectric layer 162.

In this embodiment of the present disclosure, multiple jumper layers 13 may be disposed, for example, two jumper layers 13 may be disposed. In one embodiment, the drive module layer 12 may be sequentially provided with the second insulating dielectric layer 162, the second jumper layer 13b, the third insulating dielectric layer 163 and the third jumper layer 13c, and then the third jumper layer 13c is sequentially provided with the first auxiliary layer 14, the anode layer 15 and other film layers. The second jumper portion 131b is connected to a drive module 120 through a fourth through hole K4 penetrating through the second insulating dielectric layer 162, the third jumper portion 131c is connected to a second jumper portion 131b through a third through hole K3 penetrating through the third insulating dielectric layer 163, and the blocky anode 15b is connected to a third jumper portion 131c through a first through hole K1 penetrating through the first auxiliary layer 14, so that the blocky anodes 15b are connected to the corresponding drive modules 120 through multiple layers of the jumper portions. According to the display panel provided by the embodiment, the setting of the connection portions of the blocky anodes in the anode layer 15 is reduced, which is conducive to disposing the auxiliary conductive portion 15a in the gap region between the blocky anodes to form the stable capacitance with the cathode layer. Therefore, the display quality of the display panel is improved, and the touch accuracy of the display panel integrated with a touch function is improved.

Figure 15:
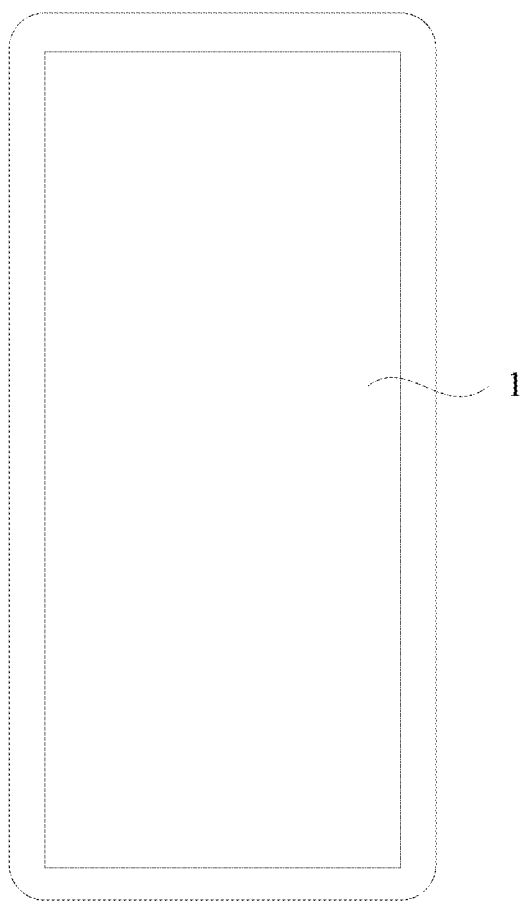
FIG. 15 is a structural view of a display device according to an embodiment of the present disclosure.

An embodiment of the present disclosure further provides a display device. FIG. 15 is a structural view of a display device according to an embodiment of the present disclosure. As shown in FIG. 15, the display device provided by the embodiment of the present disclosure includes the display panel 1 provided by any one of the embodiments of the present disclosure. The display device in the embodiment includes the features of the display panel provided by any one of the embodiments of the present disclosure and has the beneficial effects of the display panel provided by any one of the embodiments of the present disclosure. The display device may be a mobile phone as shown in FIG. 15, or may be a computer, a television, a smart wearable device, or the like, and is not specifically limited in the embodiment. In an embodiment, the display device is integrated with a touch function, and since the potential of the cathode layer of the display panel is relatively stable, the detection of the touch function can be more accurate.

What is claimed is:

1. A display panel, comprising:
   a substrate;
   a drive module layer, a first auxiliary layer, and an anode layer which are sequentially disposed on the substrate, wherein the drive module layer is provided with a plurality of drive modules; and the anode layer comprises a plurality of blocky anodes; and
   an auxiliary conductive portion; wherein a projection of at least part of the auxiliary conductive portion in a direction perpendicular to the substrate is located among the plurality of blocky anodes;
   wherein at least one jumper layer is disposed between the drive module layer and the first auxiliary layer, wherein the at least one jumper layer is disposed on a side of the auxiliary conductive portion close to the substrate; at least one jumper layer comprises a plurality of jumper portions; a blocky anode of the plurality of blocky anodes is electrically connected to a drive module of the plurality of drive modules through a jumper portion of the plurality of jumper portions; and wherein on the direction perpendicular to the substrate, the auxiliary conductive portion at least partially overlaps with the jumper portion.

2. The display panel according to claim 1, wherein the plurality of drive modules are disposed in a matrix arrangement, wherein the plurality of drive modules are disposed in rows along a first direction and in columns along a second direction, and the first direction intersects the second direction; and wherein the plurality of blocky anodes comprise a first blocky anode, a second blocky anode and a third blocky anode, three of which are disposed in a triangular arrangement; the first blocky anode and the second blocky anode are disposed in a column along the second direction; and drive modules connected to blocky anodes in a same triangle are disposed in a same row along the first direction.

3. The display panel according to claim 1, wherein, the jumper portion comprises a first end and a second end; a drive module is connected to a first end of a jumper portion corresponding to the drive module; the blocky anode is connected to a second end of a jumper portion corresponding to the blocky anode; a first end of at least one of the plurality of jumper portions does not overlap with the blocky anode; a first end of at least another one of the plurality of jumper portions overlaps with the blocky anode.

4. The display panel according to claim 3, wherein at least one of the plurality of blocky anodes is electrically connected to a second end of a jumper portion penetrating through a first through hole of the first auxiliary layer; and a vertical projection of the first through hole on the plane where the substrate is located is located within a blocky anode corresponding to the first through hole.

5. The display panel according to claim 4, wherein on the plane parallel to the plane where the substrate is located, at least one of the plurality of blocky anodes is a polygon; and the vertical projection of the first through hole on the plane where the substrate is located is within a first connection region; and the first connection region is a region, within the polygon, which is closest to the first end of the jumper portion.

6. The display panel according to claim 1, wherein a vertical projection of at least one of the plurality of jumper portions on the plane where the substrate is located is located within a blocky anode.

7. The display panel according to claim 1, wherein the first auxiliary layer is a planarization layer.

8. The display panel according to claim 1, further comprising an encapsulation layer and a touch layer;

wherein the encapsulation layer is disposed on a side of the cathode layer facing away from the substrate, and the touch layer is disposed on a side of the encapsulation layer facing away from the substrate; and wherein the touch layer comprises a metal grid structure, on the plane parallel to the plane where the substrate is located, the metal grid structure is disposed among the plurality of blocky anodes and overlaps with the auxiliary conductive portion.

9. The display panel according to claim 2, wherein the auxiliary conductive portion comprises a plurality of first auxiliary conductive portion segments and a plurality of second auxiliary conductive portion segments, wherein the plurality of first auxiliary conductive portion segments extend along the second direction; and on the plane parallel to the plane where the substrate is located, a first auxiliary conductive portion segment of the plurality of first auxiliary conductive portion segments is disposed between adjacent two columns of blocky anodes; and adjacent two first auxiliary conductive portion segments are connected through a second auxiliary conductive portion segment; and on the plane parallel to the plane where the substrate is located, the second auxiliary conductive portion segment is disposed between a first blocky anode and a second blocky anode which are adjacent to each other or between adjacent two third blocky anodes.

10. The display panel according to claim 1, wherein the auxiliary conductive portion is in a network structure; and a vertical projection of the blocky anode on the plane where the substrate is located is located within a mesh of the network structure.

11. The display panel according to claim 1, further comprising a light-emitting element, wherein the light-emitting element comprises the anode layer and a cathode layer, and forms a subpixel; and the display panel comprises subpixels of different colors; and on the plane parallel to the plane where the substrate is located, at least part of subpixels with a same color has a same first overlapped area; a first overlapped area of a subpixel is an overlapped area of a jumper portion of the subpixel and an auxiliary conductive portion corresponding to the jumper portion of the subpixel.

12. The display panel according to claim 1, wherein the auxiliary conductive portion is disposed in a same layer as the blocky anode; a material of the auxiliary conductive portion is at least one of molybdenum or titanium; and a material of the blocky anode is at least one of indium tin oxide or silver.

13. The display panel according to claim 12, wherein the auxiliary conductive portion and the blocky anode are separately formed by adopting a wet etching process; and the auxiliary conductive portion is formed prior to the blocky anode.

14. The display panel according to claim 1, further comprising: a pixel definition layer and a support pole;

wherein the pixel definition layer is disposed between the anode layer and the organic light-emitting layer; the support pole is disposed between the pixel definition layer and the organic light-emitting layer; and a vertical projection of the support pole on the plane where the substrate is located is located within the pixel definition layer; and the auxiliary conductive portion is disposed between the pixel definition layer and the support pole; and the vertical projection of the support pole on the plane where the substrate is located covers the auxiliary conductive portion.

15. The display panel according to claim 14, wherein a distance between an edge of the auxiliary conductive portion and an edge of the pixel definition layer is less than or equal to 3 μm.

16. The display panel according to claim 1, wherein the auxiliary conductive portion is disposed in a same layer as the blocky anode, and a material of the auxiliary conductive portion is same as a material of the blocky anode.

17. The display panel according to claim 16, wherein a distance between an edge of the auxiliary conductive portion and an edge of a blocky anode adjacent to the auxiliary conductive portion is less than or equal to 5 µm.

18. The display panel according to claim 16, wherein a first jumper layer is disposed between the drive module layer and the first auxiliary layer;
- a first insulating dielectric layer is disposed on a side of the drive module layer facing away from the substrate; the first jumper layer is disposed on a side of the first insulating dielectric layer facing away from the substrate; and the first jumper layer comprises a plurality of first jumper portions; and
- the blocky anode is connected to a first jumper portion corresponding to the blocky anode through a first through hole penetrating through the first auxiliary layer; and the first jumper portion is electrically connected to a drive module corresponding to the first jumper portion through a second through hole penetrating through the first insulating dielectric layer.

19. The display panel according to claim 16, wherein a second jumper layer and a third jumper layer are disposed between the drive module layer and the first auxiliary layer;
- a second insulating dielectric layer is disposed on a side of the drive module layer facing away from the substrate; the second jumper layer is disposed on a side of the second insulating dielectric layer facing away from the substrate, and the second jumper layer comprises a plurality of second jumper portions; a third insulating dielectric layer is disposed on a side of the second jumper layer facing away from the substrate; and the third jumper layer is disposed on a side of the third insulating dielectric layer facing away from the substrate, and the third jumper layer comprises a plurality of third jumper portions; and
- the blocky anode is connected to a third jumper portion among the plurality of third jumper portions corresponding to the blocky anode through a first through hole penetrating through the first auxiliary layer; the third jumper portion is connected to a second jumper portion among the plurality of second jumper portions corresponding to the third jumper portion through a third through hole penetrating through the third insulating dielectric layer; and second jumper portion among the plurality of second jumper portions is electrically connected to a drive module corresponding to the second jumper portion through a fourth through hole penetrating through the second insulating dielectric layer.

20. A display device, comprising:
a display panel;
wherein the display panel comprises:
a substrate;
a drive module layer, a first auxiliary layer, and an anode layer which are sequentially disposed on the substrate, wherein the drive module layer is provided with a plurality of drive modules; and the anode layer comprises a plurality of blocky anodes; and
an auxiliary conductive portion; wherein a projection of at least part of the auxiliary conductive portion in a direction perpendicular to the substrate is located among the plurality of blocky anodes;
wherein at least one jumper layer is disposed between the drive module layer and the first auxiliary layer, wherein the at least one jumper layer is disposed on a side of the auxiliary conductive portion close to the substrate; at least one jumper layer comprises a plurality of jumper portions; blocky anode of the plurality of blocky anodes is electrically connected to a drive module of the plurality of drive modules corresponding to the blocky anode through a jumper portion of the plurality of jumper portions; and
wherein on direction perpendicular to the substrate, the auxiliary conductive portion at least partially overlaps with the jumper portion.

* * * * *